United States Patent
Kim

[11] Patent Number: 5,859,809
[45] Date of Patent: Jan. 12, 1999

[54] SEMICONDUCTOR DEVICE OF DAISY CHAIN STRUCTURE HAVING INDEPENDENT REFRESH APPARATUS

[75] Inventor: Moo Suk Kim, Ichon, Rep. of Korea

[73] Assignee: Hyundai Electronics Industries Co., Ltd., Kyoungki-do, Rep. of Korea

[21] Appl. No.: 966,355

[22] Filed: Nov. 7, 1997

[30] Foreign Application Priority Data

Dec. 31, 1996 [KR] Rep. of Korea .................. 1996-80259

[51] Int. Cl.$^6$ ........................................... G11C 7/00
[52] U.S. Cl. ................ 365/222; 365/230.03; 365/189.12
[58] Field of Search ............................. 365/222, 230.03, 365/230.08, 189.12

[56] References Cited

U.S. PATENT DOCUMENTS

| | | |
|---|---|---|
| 4,570,242 | 2/1986 | Nagami .................................. 365/222 |
| 4,700,330 | 10/1987 | Altman et al. ......................... 365/222 |
| 4,901,283 | 2/1990 | Hanbury et al. ...................... 365/222 |
| 5,229,970 | 7/1993 | Lee et al. .............................. 365/222 |
| 5,615,328 | 3/1997 | Haddermann et al. ................ 365/222 |
| 5,654,929 | 8/1997 | Mote, Jr. ............................... 365/222 |

*Primary Examiner*—Vu A. Le
*Attorney, Agent, or Firm*—Gary M. Nath; Nath & Associates

[57] ABSTRACT

The present invention relates to a semiconductor device with a daisy chain structure having an independent, wherein each of the independent refresh means is additionally added to each of DRAMs being formed in a ring type, thereby independently performing a refresh operation in each DRAM to replace the conventional refresh operation depending on the existing single controller so that it allows easy application the semiconductor device by decreasing a DRAM's dependency to the controller.

5 Claims, 5 Drawing Sheets

SEMICONDUCTOR DEVICE OF DAISY CHAIN STRUCTURE HAVING INDEPENDENT REFRESH APPARATUS

BACKGROUND OF THE INVENTION

1. Field of the Invention

The present invention relates to a semiconductor device, and more particularly to a semiconductor device of a daisy chain structure having an independent refresh apparatus which can perform a refresh operation in each of a number of DRAMs by itself by adding the independent refresh apparatus to the DRAMs formed in a ring shape.

2. Description of the Prior Art

Generally, in an DRAM having a ring type structure such as R-DRAM with a RAMBUS structure or SYNCLINK structure as a constitution of a DRAM, when a refresh operation is performed in a cell (specifically, in a power-down mode), a number of DRAMs perform in sequence the refresh operation by means of refresh operation control signals which are provided from a controller.

Wherein, semiconductor device having a daisy chain or the ring type includes a controller to control a number of DRAMs, the controller are continuously connected with a number of DRAMs in a serial fashion, and each of DRAMs is sequentially controlled by the controller.

The daisy chain construction will be explained with reference to FIG. 1. FIG. 1 is a block diagram of a semiconductor device of a daisy chain type indicating a connection between the plurality of DRAMs (i.e., semiconductor memory device) and the system, and illustrating that the DRAMs (DRAM0–DRAMn) 10 having input/output terminals Si/So are connected in a serial fashion to one another and that controller 20 is also connected with each DRAM to commonly control the plurality of DRAMs.

At this event, the controller 20 outputs refresh operation signals SR0 to one of DRAMs which is connected most adjacently thereto and outputs enable signals to control an operation of a decoder section in each DRAM section.

FIG. 2 shows a detailed block diagram of one of the DRAMs which includes a buffer 11 for storing the signals inputted through the input terminals Si, a delay section 12 for delaying the signals outputted from the buffer 11 for a predetermined time and then outputting them, a decoder section 13 for decoding the signals outputted from the buffer 11, to check whether a DRAM identification number ID which is presently inputted is equal to an other DRAM identification number ID which is set in an initial step, and for outputting refresh control signals C1 to refresh the cell, and a RAM circuit section 14 for refreshing the cell by applying the input control signals C1 outputted from the decoding section 13.

In the semiconductor device formed in the above manner, a refresh operation through the DRAM being most adjacent to the controller are performed as below.

First, if a refresh signal SR0 is inputted in the controller 20, the refresh signal is stored in the buffer 11 and an output of the buffer 11 is inputted to both the decoding section 13 and the delay section 12.

The decoding section 13 decodes the inputted signals and checks whether the signals inputted from the controller 20 is identical to the identification number of DRAMs in operation, thereby controlling a preformation of the refresh operation in the RAM circuit section 14. Subsequently, if the refresh operation of the RAM circuit section 14 is performed, the control signals C1 are inputted to the delay section 12 so that the refresh signals which is on latching are outputted to the next DRAM.

Subsequently, a second DRAM receiving the refresh signals performs the same operation in a similar manner,, and such a same operation is operated with respect to rest DRAMs being connected in a chain.

However, in a refresh method according to the conventional daisy chain structure as above, DRAMs are refreshed in sequence through the refresh signals outputted from the single controller 20, and the controller 20 has to generate and input the signals used in the refresh operation.

Accordingly, there is a problem that since the DRAM itself does not perform either a refresh operation or an operation of signal generation, it causes a restriction in applying such a kind of DRAM circuit.

An object of the present invention to solve the problem involved in the conventional technology is to provide a semiconductor device to independently perform a refresh operation with separating status from a controller by using a power-down register value and generating refresh signals in DRAMs themselves.

Semiconductor device having a plurality of memory devices of a daisy chain, each of the memory devices comprising: clock generation section for generating a clock signal used for a refresh operation in accordance with a logic level of a power-down register which is set in a power-down mode, address count means for generating an internal row address by counting the clock signal applied from the clock generation section, and cell array block being refreshed by a refresh operation in response to the internal address outputted from the address count means.

Further, a semiconductor device of a daisy chain structure in accordance with the present invention to perform the above operation, which includes a controller and a number of semiconductor memory devices connected to the controller, is characterized by comprising a number of semiconductor memory devices which are connected to one another to independently perform a refresh operation processed in the memory devices by means of an internal address which generates by itself so that the semiconductor memory devices can perform an internal refresh operation by receiving a power-down register value provided from the controller.

BRIEF DESCRIPTION OF THE DRAWINGS

The above object and other features and advantages of the present invention will become more apparent by describing the preferred embodiments thereof with reference to the accompanying drawings in which.

DETAILED DESCRIPTION OF THE PREFERRED EMBODIMENT

Figure 1:
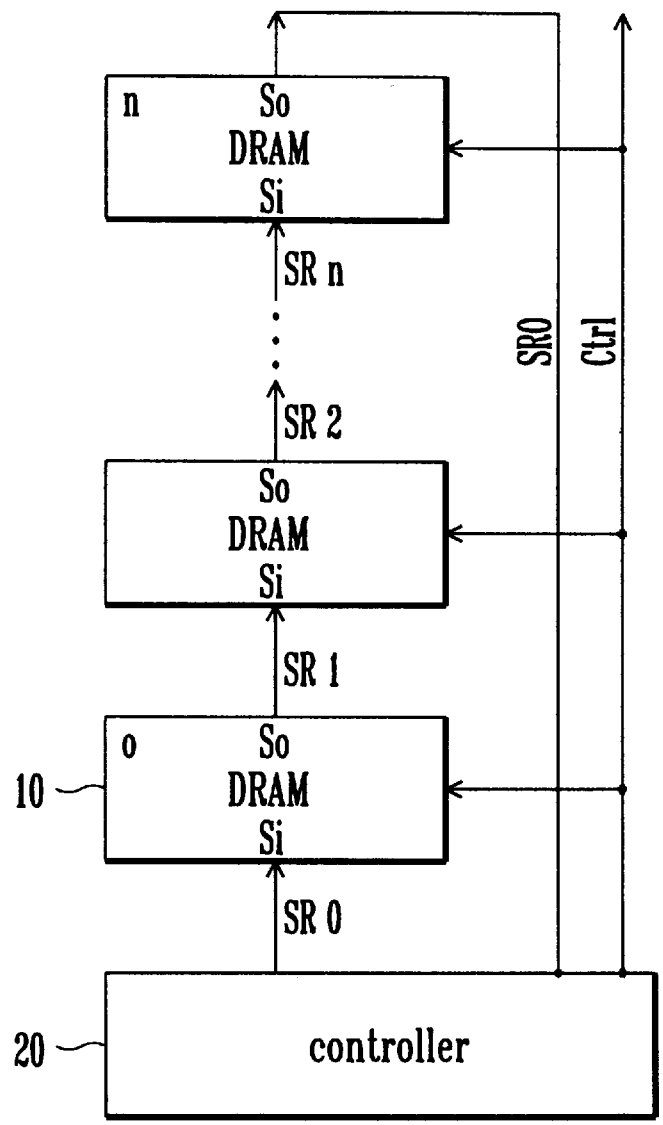
FIG. 1 is a block diagram illustrating a daisy chain type semiconductor device indicating the connection between DRAMs and a controller.
Figure 2:
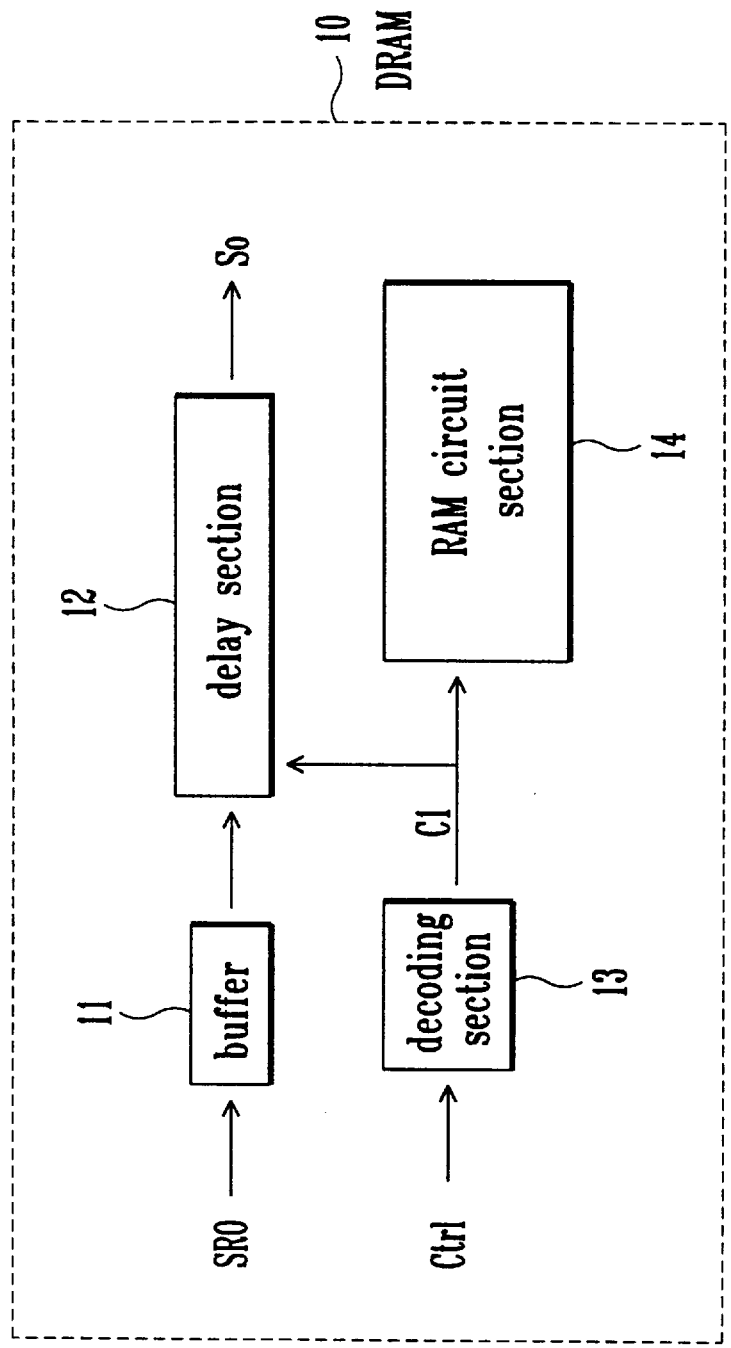
FIG. 2 is a detailed block diagram illustrating DRAMs having a refresh apparatus shown in FIG. 1.

Now, the preferred embodiment of the present invention will be explained using the same constituents as those of the conventional technology which are given by the same reference numerals as in the drawings.

In general, in a case of a power-down mode, a manner to show the mode in a circuit is performed by setting a logic high level in a power-down register of a DRAM 10 by a controller 20. But, in the contrary case, no power-down mode is shown in the circuit by setting a logic low level.

Therefore, the present invention is motivated from the above-stated features. Each DRAM checks if a value of the power-down register is at logic high level. At this event, if a logic high level signal is sensed, the internal refresh signal generator is enabled and thereby its own refresh operation is performed by using a generated clock signal.

Figure 3:
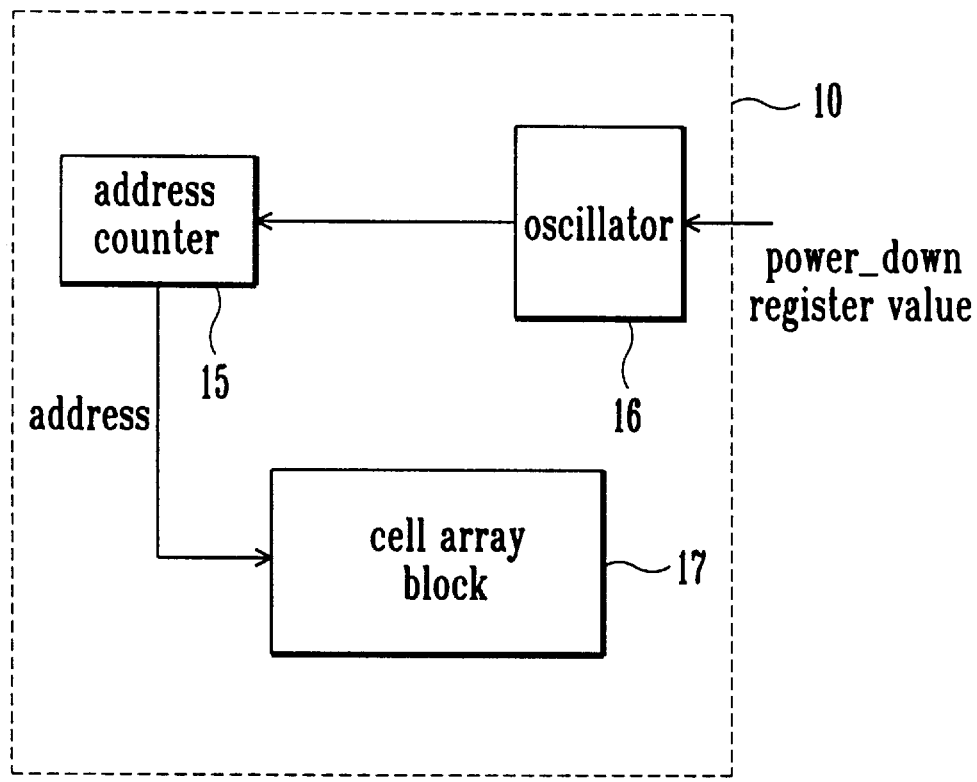
FIG. 3 is a block diagram illustrating a daisy-chain type semiconductor device according to the present invention.

The semiconductor device having a daisy chain structure of the present invention in accordance with the above-disclosed manner is illustrated in FIG. 3, which is a simplified internal block diagram of each DRAM.

In this case, each DRAM comprises an oscillator 16 for generating a clock signal to be used for the refresh operation according to the conditions of the power-down register value which is set in the power-down mode, an address counter 15 for generating an internal row address by counting the clock signal applied from the oscillator 16, and a cell array block 17 for performing the refresh operation by itself through the address outputted from the address counter 15.

Figure 4:
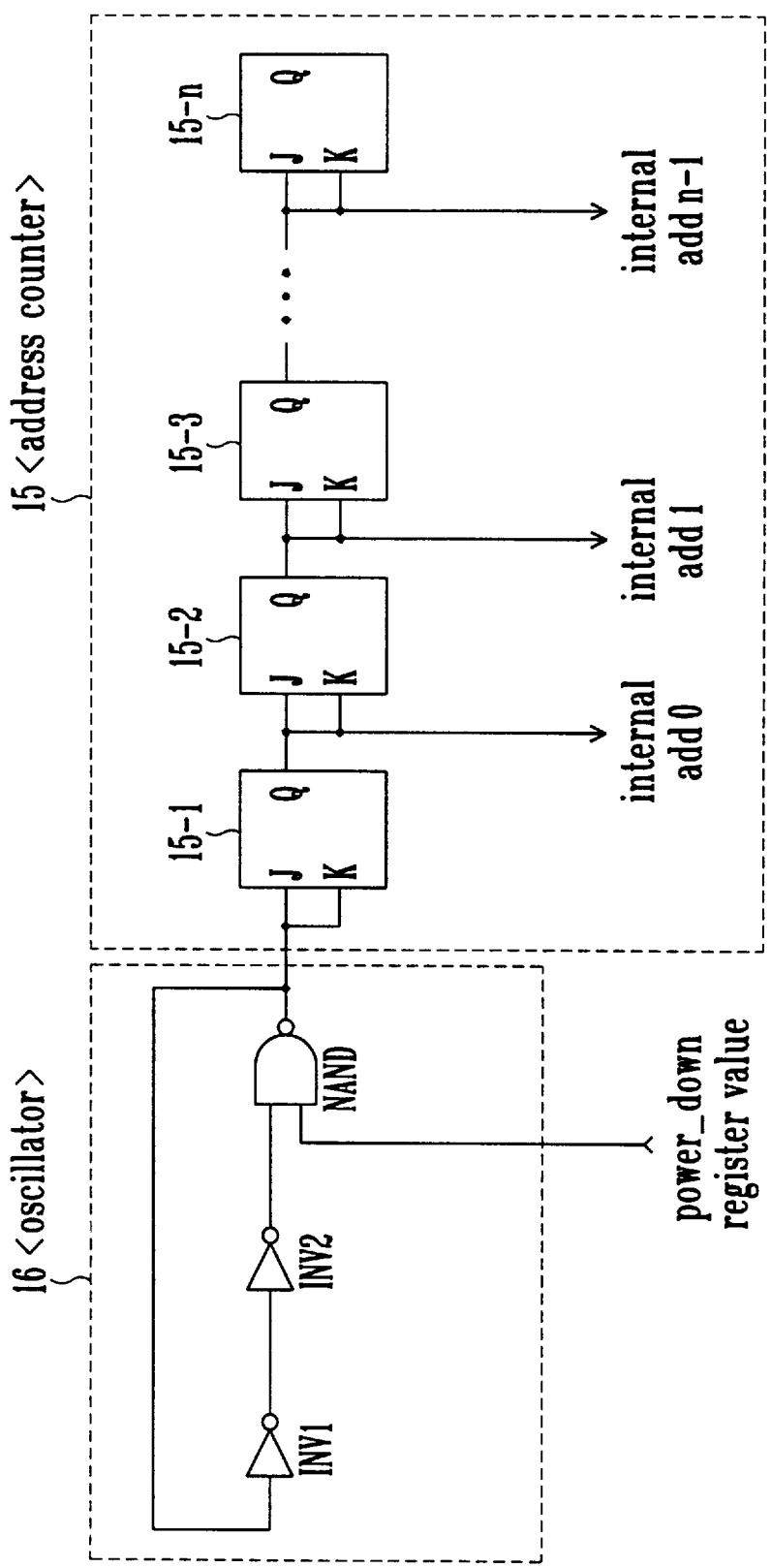
FIG. 4 is a detailed circuit diagram of an oscillator and an address counter shown in FIG. 3.

Detailed circuit diagrams of the oscillator 16 and the address counter 15 are illustrated in FIG. 4. Referring to FIG. 4, the oscillator 16 comprises a plurality of inverters INV1 and INV2 for continuously inverting a feedback signal of its closed loop which provides the final output of the oscillator 16, and an NAND gate for performing NAND operation with the value inputted from the inverter INV2 and the power-down register value which are inputted thereto.

Further, the address counter 15 comprises a first flip flop 15-1 for receiving the signal inputted from the NAND gate through input terminals J and K and performing J–K flip flop operation, a second flip-flop 15-2 for receiving an output signal provided from a output terminal Q of the first flip-flop 15-1 through input terminals J and K and performing J-K flip flop operation, and a number of flip-flops 15-n being connected in a same manner to each of the flip-flops 15-1 and 15-2.

Herein, it is preferable that a number of flip-flops 15-1 to 15-n use J–K flip-flops, that number of flip-flops used as many as that number of row addresses embodied in the cell array, and the output of the first flip-flop 15-1 is used as the row address to be inputted in the cell array in a power-down mode.

All of devices which can perform the NAND operation can be used as the NAND gate.

Figure 5:
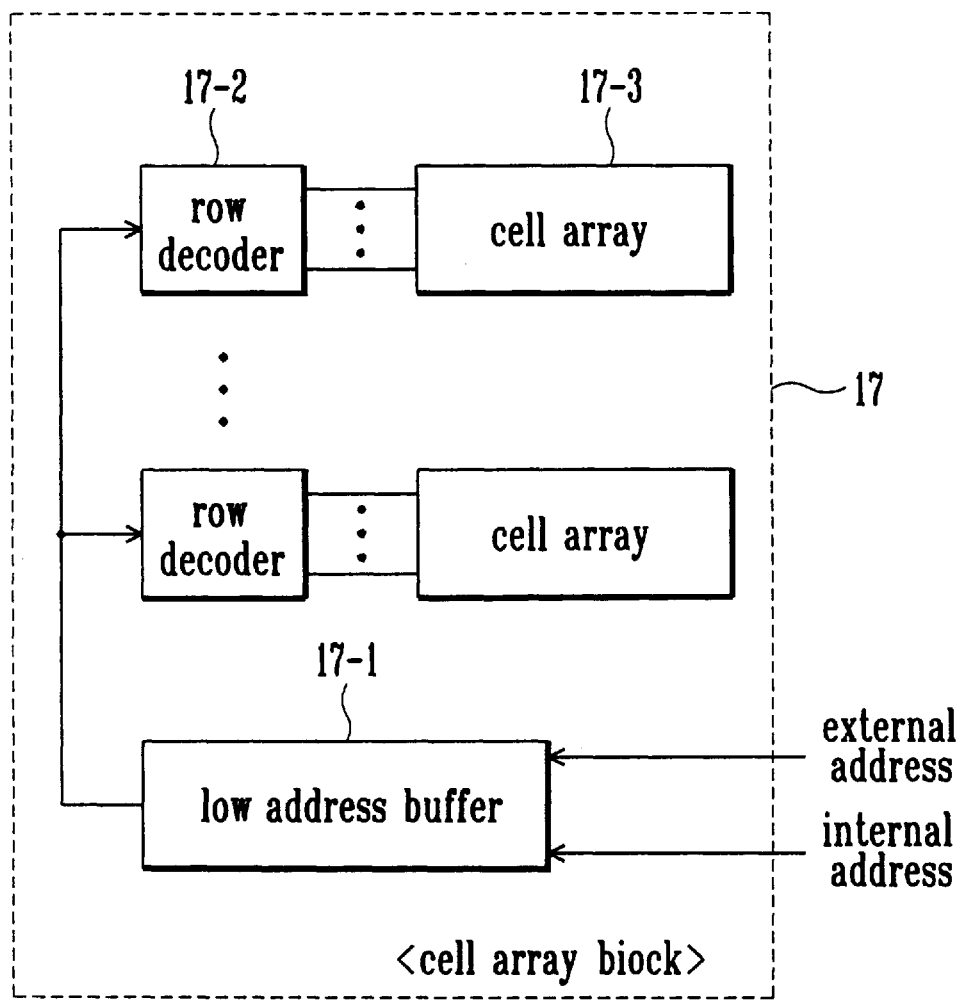
FIG. 5 is a detailed block diagram of a cell array block shown in FIG. 3.

As illustrated in FIG. 5, the cell array block 17 comprises a row address buffer 17-1 for storing external addresses which are outputted from the address counter 15, a plurality of row decoders 17-2 for decoding the address outputted from the row address buffer 17-1 and outputting a row address being applied to each cell array, and a plurality of cell arrays 17-3 for refreshing cells in accordance with the addresses outputted in the row decoders.

In a case that an external address is stored on each address which is inputted to the row address buffer 17-1 in a normal status where DRAM performs a refresh operation by receiving an inputted external address, while the internal address generated by itself is also stored in a power down mode.

The operation of the semiconductor device having the refresh device in accordance with the present invention is explained as below.

If a circuit operating in the normal status is converted into the power-down mode and a logic high level is set in the power-down register by the controller 20, the logic high level signal is inputted to the NAND gate of a oscillator 16, and the oscillator generates and outputs a clock signal to the address counter 15.

The generation of the clock signal in the oscillator 16 will be explained in the manner that the NAND gate receiving an input value of the power-down register outputs a logic high level such as "1" at a previous logic low level such as "0" and repeatedly outputs the logic high and low level signals such as "1, 0, 1, 0" while being feedbacked subsequently until the power-down register value is changed into the logic low level, thereby providing a clock signal required in the refresh operation.

The output signal of the NAND gate is inputted to the first flip-flop 15-1 in the address counter 15. After delaying a predetermined time, the output signal of the first flip-flop 15-1 is inputted to the next second flip-flop 15-2 and simultaneously provided to the internal address Internal add0, and this operation is continued to the final flip-flop 15-n in the same manner.

Next, the internal address Internal add0 is continuously in sequence (internal add0–internal addn-1) stored in the row address buffer 17-1 and inputted as a row decoder 17-2.

In the row decoder 17-2, the inputted address is outputted to the cell array 17-3 by decoding so that the refresh operation is performed.

As described above, the present invention provides a semiconductor device wherein the refresh operation conventionally performed by using one controller is replaced by an independent refresh operation in each DRAM, thereby allowing easy application in a semiconductor device by reducing a dependence of DRAM to the controller.

In addition, while the foregoing sets forth a preferable embodiment of the present invention for a purpose of exemplification in detail, it will be appreciated that various modifications, changes or additions thereto may be made without departing from the spirit and scope thereof. Accordingly, only such limitations are to be imposed on the invention as are indicated in the appended claims.

What is claimed is:

1. Semiconductor device having a plulariry of memory devices of a daisy chain, each of the memory devices comprising:

clock generation section for generating a clock signal used for a refresh operation in accordance with a logic level of a power-down register which is set in a power-down mode, address count means for generating an internal row address by counting the clock signal applied from the clock generation section, and cell array block being refreshed by a refresh operation in response to the internal address outputted from the address count means.

2. Semiconductor device having a plularity of memory devices of a daisy chain according to 1: wherein each of the memory devices is coupled with a controller which outputs the power-down register value, and independently performs each refresh operation which should be processed in the memory device when the power-down register value is activated.

3. Semiconductor device having a plularity of memory devices of a daisy chain according to 1, wherein said clock generation section comprises a plurality of inversion means for inverting the final output signal of said clock generation section which is feedbacked therein, and logic device for performing NAND operation by receiving the input signal of said power-down register and the output signal of said plurality of inversion means.

4. Semiconductor device having a plurality of memory devices of a daisy chain according to 1, wherein said address counting means counts the clock signal provided from said clock generational section and outputs to a flip-flop of the next terminal, and includes a plurality of flip-flops to be outputted to the internal address to be refreshed as many as the number corresponding to the number of row addresses in the cell block.

5. Semiconductor device having a plularity of memory devices of a daisy chain according to 1, wherein said cell array block comprises a row address buffer for storing said external addresses when the semiconductor memory device performs a normal mode status, or receiving and storing said internal addresses ouputted from said address count means when the semiconductor memory device performs in a power-down mode status.

* * * * *